United States Patent
Matsuo et al.

(10) Patent No.: US 12,237,597 B2
(45) Date of Patent: Feb. 25, 2025

(54) CONNECTOR

(71) Applicant: Japan Aviation Electronics Industry, Limited, Tokyo (JP)

(72) Inventors: Seiya Matsuo, Tokyo (JP); Tetsuya Komoto, Tokyo (JP); Akira Kimura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 404 days.

(21) Appl. No.: 17/842,518

(22) Filed: Jun. 16, 2022

(65) Prior Publication Data
US 2023/0061252 A1 Mar. 2, 2023

(30) Foreign Application Priority Data
Aug. 30, 2021 (JP) ................................. 2021-140068

(51) Int. Cl.
| | |
|---|---|
| *H01R 12/59* | (2011.01) |
| *H01R 13/02* | (2006.01) |
| *H01R 13/24* | (2006.01) |
| *H01R 13/41* | (2006.01) |
| *H01R 13/502* | (2006.01) |
| *H05K 1/18* | (2006.01) |

(52) U.S. Cl.
CPC ......... *H01R 12/592* (2013.01); *H01R 13/025* (2013.01); *H01R 13/2414* (2013.01); *H01R 13/41* (2013.01); *H01R 13/502* (2013.01); *H05K 1/189* (2013.01)

(58) Field of Classification Search
CPC ................ H01R 12/592; H01R 13/025; H01R 13/2414; H01R 13/41; H01R 12/502; H05K 1/189
USPC .......................................................... 439/67
See application file for complete search history.

(56) References Cited

U.S. PATENT DOCUMENTS

| | | | |
|---|---|---|---|
| 6,370,770 B1 * | 4/2002 | Fan .................... | H01R 12/7005 29/877 |
| 11,177,597 B2 * | 11/2021 | Hashiguchi .......... | H01R 12/592 |

(Continued)

FOREIGN PATENT DOCUMENTS

| | | | | |
|---|---|---|---|---|
| EP | 2992971 A2 | * | 3/2016 | ........... A61B 8/4444 |
| EP | 3086576 A1 | * | 10/2016 | ........... H04R 25/609 |

(Continued)

*Primary Examiner* — Gary F Paumen
(74) *Attorney, Agent, or Firm* — Muncy, Geissler, Olds & Lowe, P.C

(57) ABSTRACT

A connector includes a contact connected to a flexible conductor, a housing that is attached to a flexible substrate and retains the contact, and a protection sheet that is constituted of an insulating film having a pressure-sensitive adhesive layer formed on one surface thereof and is disposed between the housing and the flexible substrate such that the pressure-sensitive adhesive layer faces the flexible substrate, the protection sheet being disposed so as to cover at least a front surface part of the flexible substrate on which the flexible conductor is formed, and is adhered to the flexible substrate with the pressure-sensitive adhesive layer, the housing having a flat surface facing the flexible substrate, an adhesive layer bonding the housing to the protection sheet being disposed between the flat surface and the protection sheet.

18 Claims, 13 Drawing Sheets

(56) References Cited

U.S. PATENT DOCUMENTS

| | | | |
|---|---|---|---|
| 2004/0029411 A1* | 2/2004 | Rathburn | H01R 12/79 |
| | | | 257/E23.068 |
| 2007/0167089 A1* | 7/2007 | Gobron | H01R 12/777 |
| | | | 439/860 |
| 2016/0270727 A1 | 9/2016 | Berg et al. | |
| 2021/0098914 A1 | 4/2021 | Hashiguchi | |

FOREIGN PATENT DOCUMENTS

| | | | |
|---|---|---|---|
| JP | 2021057294 A | 4/2021 | |
| WO | WO-03079495 A1 * | 9/2003 | H01R 13/2414 |

* cited by examiner

CONNECTOR

BACKGROUND OF THE INVENTION

The present invention relates to a connector, particularly to a connector connected to a flexible conductor.

As a connector connected to a flexible conductor, for instance, JP 2021-57294 A discloses a connector shown in FIG. 32. This connector is a wearable connector attached to, for example, a garment and includes a first insulator 2 and a second insulator 3 facing each other with a flexible substrate 1 being sandwiched therebetween. A contact insertion hole 2A is formed in the first insulator 2, and a receiving member 4 of ring shape is fitted to an annular stepped portion 2B formed at a circumferential edge of the contact insertion hole 2A.

A tubular portion 5A of a contact 5 is inserted into the contact insertion hole 2A of the first insulator 2 to project from the first insulator 2, and a flange 5B of the contact 5 is sandwiched between the first insulator 2 and the second insulator 3, whereby the contact 5 is retained in the first insulator 2 and the second insulator 3.

The flexible substrate 1 is disposed between the first insulator 2 and the second insulator 3 such that a front surface and a rear surface of the flexible substrate 1 face the first insulator 2 and the second insulator 3, respectively, and an opening end portion of the flexible substrate 1 is bent in a direction in which the contact 5 projects, and is sandwiched between a large diameter portion 5C formed at a root of the tubular portion 5A of the contact 5 and the receiving member 4, whereby a flexible conductor 6 disposed on the rear surface of the flexible substrate 1 makes contact with the large diameter portion 5C of the contact 5 and is electrically connected to the contact 5.

The second insulator 3 is adhered to the rear surface of the flexible substrate with an adhesive agent, and the front surface of the flexible substrate 1 and the first insulator 2 are also adhered to each other with an adhesive agent, and further, a waterproof member 7 of ring shape is disposed between the contact insertion hole 2A of the first insulator 2 and the tubular portion 5A of the contact 5, whereby water is prevented from penetrating from the outside of the connector to a contact part between the flexible conductor 6 and the large diameter portion 5C of the contact 5.

As an adhesive agent bonding each of the first insulator 2 and the second insulator 3 to the flexible substrate 1, for example, an adhesive agent made of a thermosetting resin or a thermoplastic resin, which is cured by a heating treatment, can be used. An adhesive agent made of a thermosetting resin undergoes a chemical reaction caused by being heated and is cured, whereas an adhesive agent made of a thermoplastic resin is softened by being heated and is then cured by being cooled.

In addition, one example of the flexible substrate 1 is a substrate obtained by forming the flexible conductor 6, by printing, on a front surface of a substrate body constituted of a resin film. This flexible substrate 1 is disposed on cloth of a garment and heated so that the resin film of the substrate body is melted and welded to the cloth of the garment, whereby wiring constituted of the flexible conductor 6 can be formed on a surface of the garment.

However, in the case where an assembling step of attaching the connector shown in FIG. 32 to the flexible substrate 1 in which the flexible conductor 6 is formed by printing in this manner is conducted, when a heating treatment is performed to cure an adhesive agent applied to the adhesive part for the purpose of bonding each of the first insulator 2 to the second insulator 3 and the flexible substrate 1, the resin film forming the substrate body of the flexible substrate 1 may be dissolved. In this case, since the adhesive agent is in direct contact with the flexible substrate 1, when the adhesive agent flowed by being heated fills the adhesive part, the flexible conductor 6 situated on the dissolved resin film may receive a force from the flowing adhesive agent and deform, and further disconnect.

If the flexible conductor 6 disconnects, the function of the connector is impaired.

SUMMARY OF THE INVENTION

The present invention has been made to solve the conventional problem described above and aims at providing a connector capable of preventing disconnection of a flexible conductor when an adhesive agent is heated to provide waterproof property and establishing highly reliable electrical connection.

A connector according to the present invention is one attached to a flexible substrate having a sheet-like shape and having a flexible conductor formed on a front surface of a substrate body, the connector comprising:

at least one contact made of a conductive material and connected to the flexible conductor, a housing that is attached to the flexible substrate and retains the contact; and a protection sheet constituted of an insulating film having a pressure-sensitive adhesive layer formed on one surface of the protection sheet and disposed between the housing and the flexible substrate such that the pressure-sensitive adhesive layer faces the flexible substrate, wherein the protection sheet is disposed so as to cover at least a front surface part of the flexible substrate on which the flexible conductor is formed, and is adhered to the flexible substrate with the pressure-sensitive adhesive layer, wherein the housing has a flat surface facing the flexible substrate, and wherein an adhesive layer bonding the housing to the protection sheet is disposed between the flat surface and the protection sheet.

DETAILED DESCRIPTION OF THE INVENTION

Embodiments of the present invention are described below with reference to the accompanying drawings.

Embodiment 1

Figure 1:
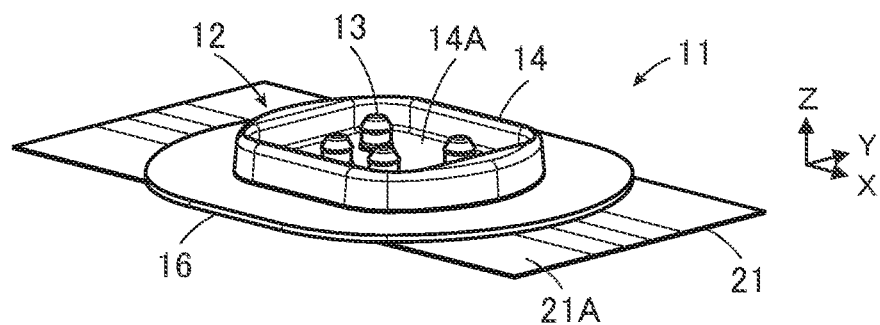
FIG. 1 is a perspective view showing a connector according to Embodiment 1 of the present invention when viewed from an obliquely upper position.
Figure 2:
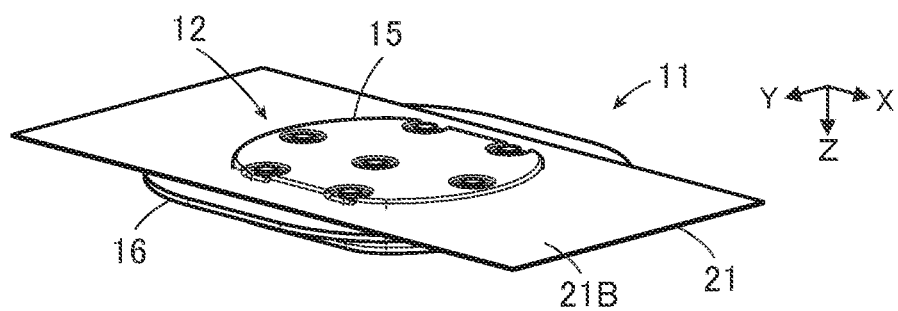
FIG. 2 is a perspective view showing the connector according to Embodiment 1 when viewed from an obliquely lower position.

FIGS. 1 and 2 show a connector 11 according to Embodiment 1. The connector 11 is used as, for example, a garment-side connector portion for fitting a wearable device and is mounted on a sheet-like flexible substrate 21.

The connector 11 includes a housing 12 made of an insulating material. In the housing 12, four contacts 13 are retained so as to project perpendicularly to the flexible substrate 21 in two arrays parallel to each other.

The housing 12 includes a first insulator 14 that is disposed on a front surface 21A of the flexible substrate 21, and a second insulator 15 that is disposed on a rear surface 21B of the flexible substrate 21 and faces the first insulator 14. The first insulator 14 and the second insulator 15 have oval flat shapes of the substantially same size.

The first insulator 14 is disposed on the front surface 21A of the flexible substrate 21 via a reinforcement sheet 16 and has a recessed portion 14A opening in the opposite direction from the flexible substrate 21. In the recessed portion 14A of the first insulator 14, the four contacts 13 project perpendicularly to a bottom surface of flat shape of the recessed portion 14A.

For convenience, the bottom surface of the recessed portion 14A of the first insulator 14 is defined as extending along an XY plane, the direction in which the four contacts 13 are aligned in two arrays is referred to as "X direction," and the direction in which the four contacts 13 project is referred to as "+Z direction." The Z direction is a fitting direction in which the connector 11 is fitted to a counter connector (not shown), and the recessed portion 14A of the first insulator 14 constitutes a counter connector accommodating portion in which part of a counter connector (not shown) is to be accommodated.

Figure 3:
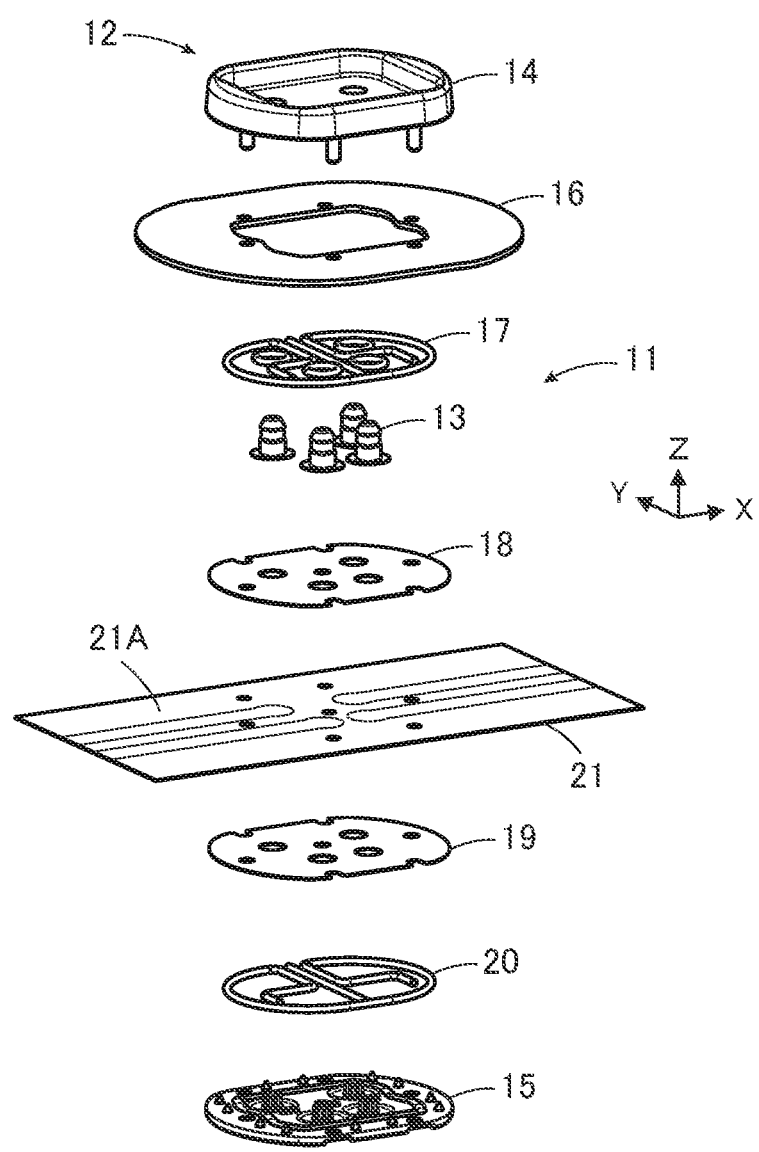
FIG. 3 is an assembly view showing the connector according to Embodiment 1 when viewed from an obliquely upper position.
Figure 4:
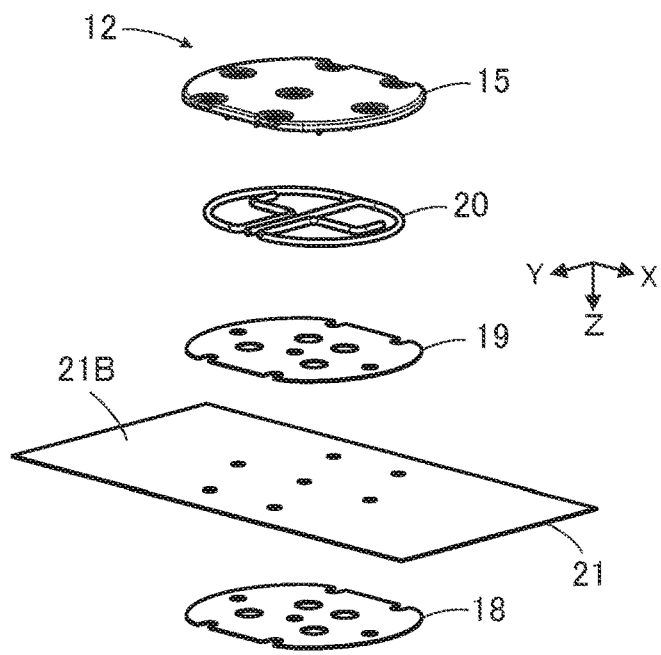
FIG. 4 is an assembly view showing the connector according to Embodiment 1 when viewed from an obliquely lower position.

FIGS. 3 and 4 show assembly views of the connector 11. The reinforcement sheet 16 is disposed on the −Z direction side of the first insulator 14, the four contacts 13 are disposed on the −Z direction side of the reinforcement sheet 16 via an adhesive agent 17, and the flexible substrate 21 is disposed on the −Z direction side of the four contacts 13 via a protection sheet 18. Further, a fixing sheet 19 is disposed on the −Z direction side of the flexible substrate 21, and the second insulator 15 is disposed on the −Z direction side of the fixing sheet 19 via an adhesive agent 20.

Figure 5:
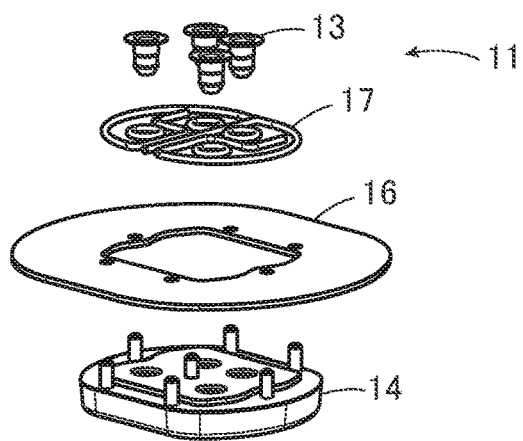
FIG. 5 is a perspective view showing a first insulator used in the connector according to Embodiment 1 when viewed from an obliquely upper position.
Figure 6:
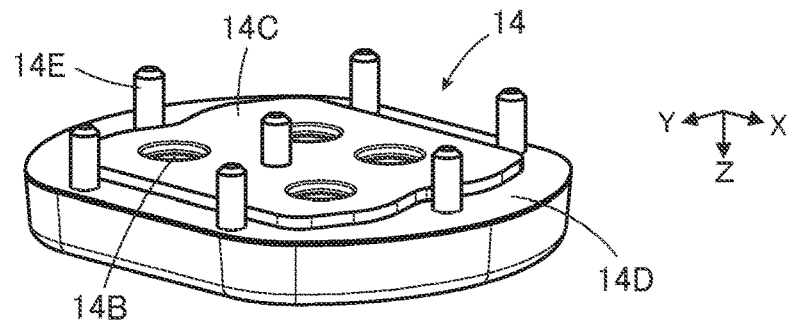
FIG. 6 is a perspective view showing the first insulator used in the connector according to Embodiment 1 when viewed from an obliquely lower position.

As shown in FIGS. 5 and 6, the first insulator 14 includes four contact insertion holes 14B penetrating the bottom surface of the recessed portion 14A in the Z direction. The four contact insertion holes 14B separately correspond to the four contacts 13. In addition, at a center portion on the −Z direction side of the first insulator 14, a flat surface 14C is formed to extend along an XY plane and face in the −Z direction. At a peripheral edge portion of the flat surface 14C, a circumferential surface 14D is formed so as to surround the entire periphery of the flat surface 14C, which circumferential surface 14D is situated on the +Z direction side of the flat surface 14C, extends along an XY plane and faces in the −Z direction.

In addition, on the flat surface 14C and the circumferential surface 14D of the first insulator 14, a plurality of fixing posts 14E are formed to project in the −Z direction.

Figure 7:
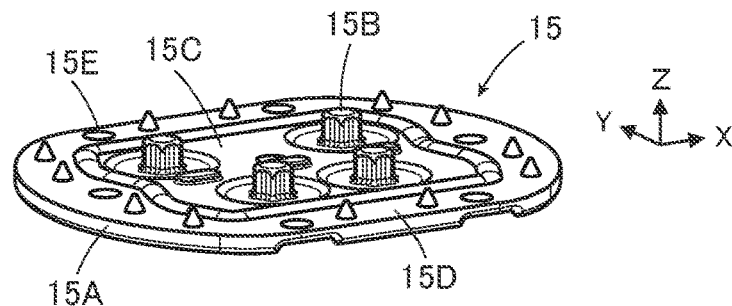
FIG. 7 is a perspective view of a second insulator used in the connector according to Embodiment 1 when viewed from an obliquely upper position.
Figure 8:
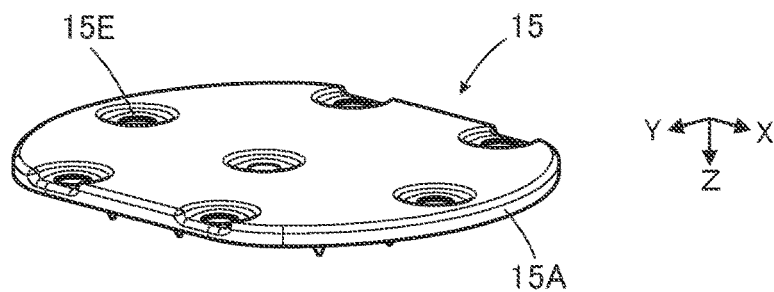
FIG. 8 is a perspective view showing the second insulator used in the connector according to Embodiment 1 when viewed from an obliquely lower position.

As shown in FIGS. 7 and 8, the second insulator 15 includes a base portion 15A of flat plate shape and four projections 15B projecting in the +Z direction from the base portion 15A. The four projections 15B separately correspond to the four contacts 13. At a center portion of the base portion 15A, a flat surface 15C is formed to extend along an XY plane and face in the +Z direction, and the four projections 15B project in the +Z direction from the flat surface 15C. At a peripheral edge portion of the flat surface 15C, a circumferential surface 15D is formed so as to surround the entire periphery of the flat surface 15C, extend along an XY plane and face in the +Z direction.

In addition, in the flat surface 15C and the circumferential surface 15D of the second insulator 15, a plurality of through-holes 15E are formed to penetrate the base portion 15A in the Z direction. The plurality of through-holes 15E separately correspond to the plurality of fixing posts 14E of the first insulator 14.

Figure 9:
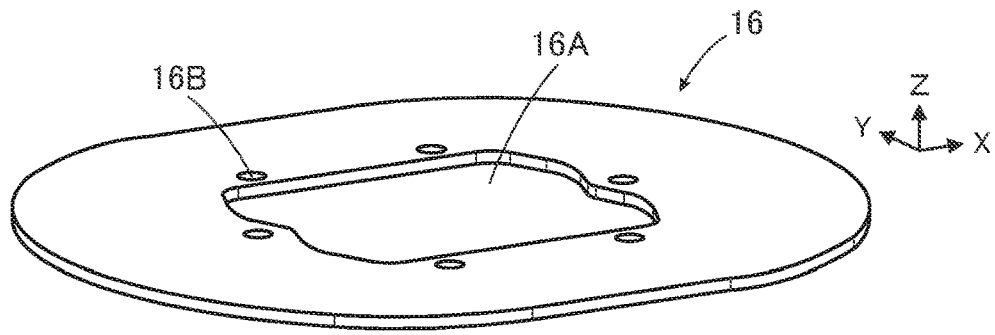
FIG. 9 is a perspective view showing a reinforcement sheet used in the connector according to Embodiment 1.

The reinforcement sheet 16 is provided to reinforce the flexible substrate 21 and has an outer peripheral portion larger than the first insulator 14 when viewed in the Z direction, and as shown in FIG. 9, at a center portion of the reinforcement sheet 16, an opening portion 16A is formed to penetrate the reinforcement sheet 16. The opening portion 16A has a size and a shape that correspond to the flat surface 14C of the first insulator 14. In addition, the reinforcement sheet 16 has a thickness corresponding to a height difference in the Z direction between the flat surface 14C and the circumferential surface 14D of the first insulator 14.

Around the opening portion 16A, a plurality of through-holes 16B are formed to penetrate the reinforcement sheet 16. The plurality of through-holes 16B separately correspond to the plurality of fixing posts 14E of the first insulator 14.

The reinforcement sheet 16 as above is formed of, for example, a resin having excellent stretchability such as polyurethane.

Figure 10:
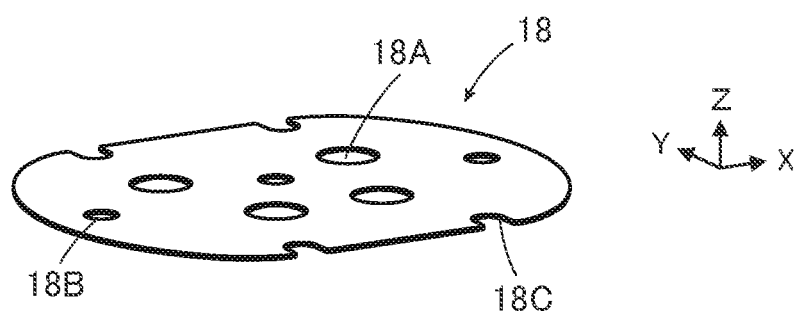
FIG. 10 is a perspective view showing a protection sheet used in the connector according to Embodiment 1.

As shown in FIG. 10, the protection sheet 18 is constituted of an insulating film having an oval shape slightly smaller than an outline of the circumferential surface 14D of the first insulator 14 and larger than the opening portion 16A of the reinforcement sheet 16, and at a center portion of the protection sheet 18, four projection insertion holes 18A are formed to penetrate the protection sheet 18. These four projection insertion holes 18A separately correspond to the four contacts 13.

As an insulating film constituting the protection sheet 18, for example, a polyethylene terephthalate (PET) film (heat resistant temperature: about 150° C.), a polyimide film (heat resistant temperature: about 200° C.), a so-called retort pouch (heat resistant temperature: about 130° C.) produced by performing laminate processing with a resin film such as polypropylene can be used.

Three through-holes 18B penetrating the protection sheet 18 are formed on a center line in the Y direction of the protection sheet 18, and four cutouts 18C are formed at a +Y directional edge portion and a −Y directional edge portion of the protection sheet 18. These through-holes 18B and cutouts 18C separately correspond to the plurality of fixing posts 14E of the first insulator 14.

A pressure-sensitive adhesive layer is formed over an entire area of a surface, of opposite surfaces of the protection sheet 18, facing in the −Z direction, i.e., facing the front surface 21A of the flexible substrate 21. A pressure-sensitive adhesive layer exhibits an adhesion effect only by being pressurized for a short time at normal temperature without using water, a solvent, heat or the like. A pressure-sensitive adhesive layer is not formed on a surface, facing in the +Z direction, of the protection sheet 18.

Figure 11:
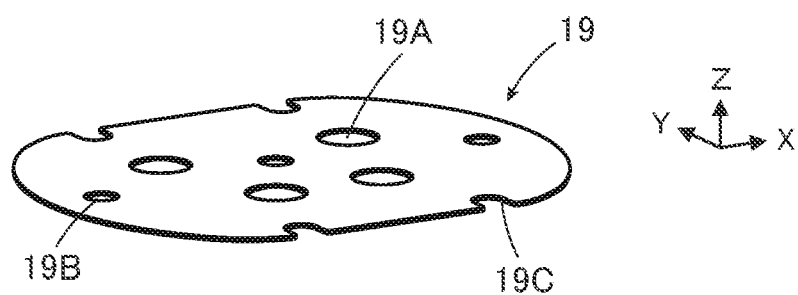
FIG. 11 is a perspective view showing a fixing sheet used in the connector according to Embodiment 1.

As shown in FIG. 11, the fixing sheet 19 has the same size, shape and material as those of the protection sheet 18. In other words, the fixing sheet 19 is constituted of an insulating film having an oval shape slightly smaller than the outline of the circumferential surface 14D of the first insulator 14, and at a center portion of the fixing sheet 19, four projection insertion holes 19A are formed to penetrate the fixing sheet 19. These four projection insertion holes 19A separately correspond to the four contacts 13.

Three through-holes 19B penetrating the fixing sheet 19 are formed on a center line in the Y direction of the fixing sheet 19, and four cutouts 19C are formed at a +Y directional edge portion and a −Y directional edge portion of the fixing sheet 19. These through-holes 19B and cutouts 19C separately correspond to the plurality of fixing posts 14E of the first insulator 14.

A pressure-sensitive adhesive layer is formed over an entire area of a surface, of opposite surfaces of the fixing sheet 19, facing in the +Z direction, i.e., facing the rear surface 21B of the flexible substrate 21. A pressure-sensitive adhesive layer is not formed on a surface, facing in the −Z direction, of the fixing sheet 19.

Figure 12:
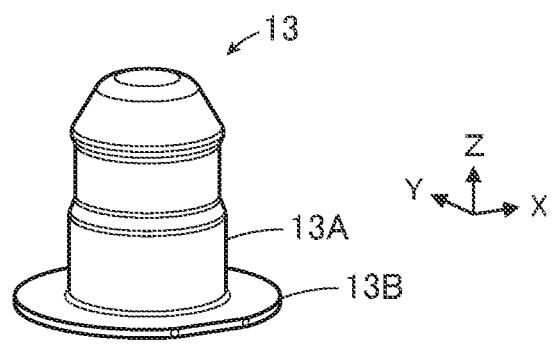
FIG. 12 is a perspective view showing a contact used in the connector according to Embodiment 1 when viewed from an obliquely upper position.
Figure 13:
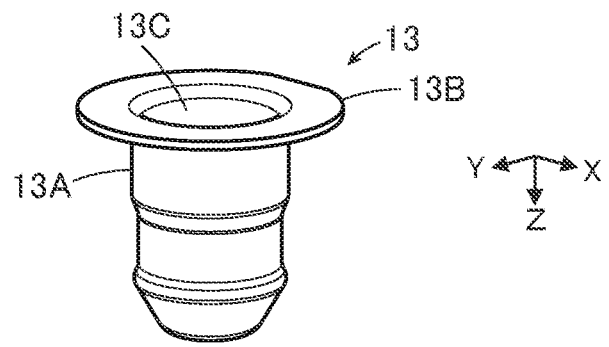
FIG. 13 is a perspective view showing the contact used in the connector according to Embodiment 1 when viewed from an obliquely lower position.

As shown in FIGS. 12 and 13, the contact 13 is a plug-type contact made of a conductive material such as metal and includes a tubular portion 13A of cylindrical shape that extends in the +Z direction and a flange 13B that is formed integrally with the −Z directional end of the tubular portion 13A and extends out of the tubular portion 13A along an XY plane.

The tubular portion 13A of the contact 13 has an outside diameter smaller than an inside diameter of the contact insertion hole 14B of the first insulator 14, and the flange 13B of the contact 13 has an outside diameter larger than the inside diameter of the contact insertion hole 14B of the first insulator 14.

The tubular portion 13A is provided in its interior with a projection accommodating portion 13C of recess shape opening in the −Z direction. The projection accommodating portion 13C has an inside diameter slightly smaller than a value obtained by adding a double of a thickness of the flexible substrate 21 to an outside diameter of the projection 15B of the second insulator 15. The contact 13 as above can be manufactured by, for example, performing press working, cutting, drawing or other processing on a metal material.

Figure 14:
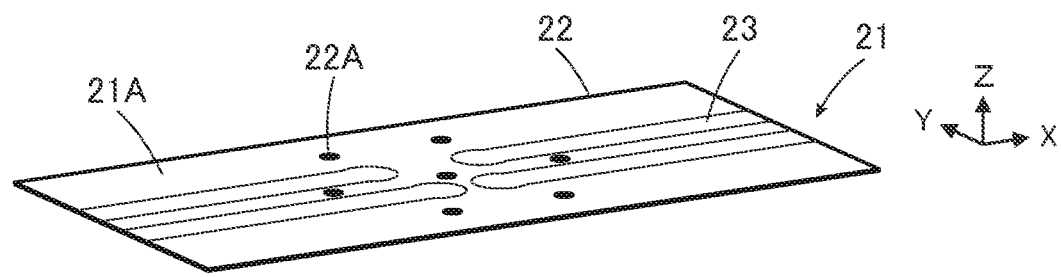
FIG. 14 is a perspective view showing a flexible substrate to which the connector according to Embodiment 1 is to be attached when viewed from an obliquely upper position.
Figure 15:
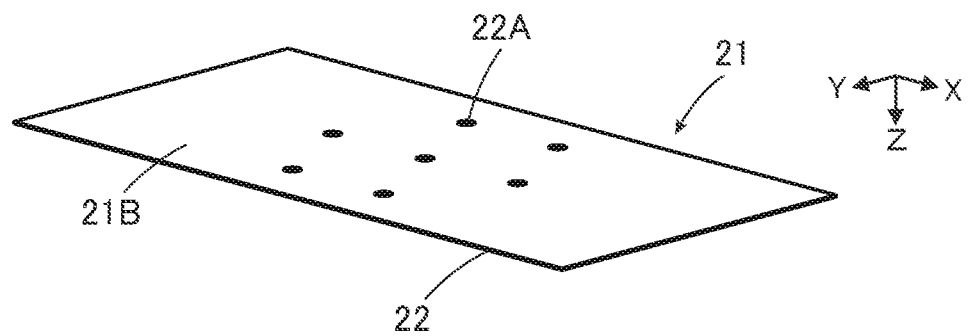
FIG. 15 is a perspective view showing the flexible substrate to which the connector according to Embodiment 1 is to be attached when viewed from an obliquely lower position.

As shown in FIGS. 14 and 15, the flexible substrate 21 is configured such that a plurality of flexible conductors 23 are formed, by printing, on a front surface of a substrate body 22 constituted of a resin film. The flexible substrate 21 is disposed on cloth of a garment and heated with an iron or the like, and a resin film forming the substrate body 22 is melted so that the flexible substrate 21 is welded to the cloth of the garment, whereby wiring constituted of the flexible conductors 23 can be formed on the front surface of the garment.

Note that the connector 11 can also be attached to a surface of a garment in which wiring constituted of the flexible conductor 23 is formed in advance.

On the front surface 21A of the flexible substrate 21, two flexible conductors 23 are disposed to extend in parallel to each other in the +X direction from a center portion of the flexible substrate 21, and two flexible conductors 23 are disposed to extend in parallel to each other in the −X direction from the center portion of the flexible substrate 21. These flexible conductors 23 separately correspond to the four contacts 13. A flexible conductor 23 is not disposed on the rear surface 21B of the flexible substrate 21.

At a center portion of the substrate body 22 of the flexible conductor 21, a plurality of through-holes 22A are formed to penetrate the substrate body 22. These through-holes 22A are separately correspond to the plurality of fixing posts 14E of the first insulator 14.

The adhesive agent 17 shown in FIGS. 3 and 4 allows a surface, facing in the +Z direction, of the protection sheet 18 to be adhered to the flat surface 14C of the first insulator 14 and to an edge portion of the opening portion 16A of the reinforcement sheet 16, the edge portion surrounding the opening portion 16A, and fills between the tubular portion 13A of the contact 13 and the contact insertion hole 14B of the first insulator 14 over a whole circumference of the tubular portion 13A.

In addition, the adhesive agent 20 allows a surface, facing in the −Z direction, of the fixing sheet 19 to be adhered to the flat surface 15C and the circumferential surface 15D of the second insulator 15.

As these adhesive agents 17 and 20, for example, an adhesive agent made of a thermosetting resin is used. For example, an adhesive agent made of a thermosetting resin exhibits fluidity at normal temperature, undergoes chemical reaction caused by being heated and is cured.

Note that an insulating film and a pressure-sensitive adhesive layer constituting each of the protection sheet 18 and the fixing sheet 19 each have a heat resistant temperature higher than a heating treatment temperature of the adhesive agents 17 and 20. In other words, even in an atmosphere in which a heating treatment is performed in order to cure the adhesive agents 17 and 20, the protection sheet 18 and the fixing sheet 19 are not dissolved, and an adhesion effect by the pressure-sensitive adhesive layer is not substantially impaired.

Here, a method of attaching the connector 11 to the flexible substrate 21 is described.

Figure 16:
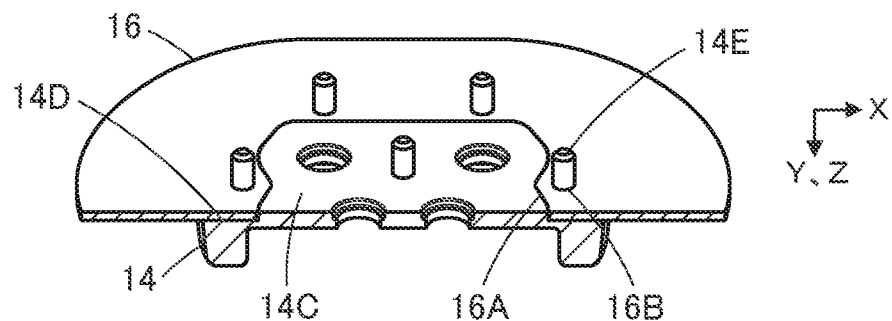
FIG. 16 is a partial cross-sectional perspective view showing a state where the reinforcement sheet is attached to the first insulator.

First, as shown in FIG. 16, the reinforcement sheet 16 is moved toward the first insulator 14 from the −Z direction to the +Z direction while the plurality of fixing posts 14E of the first insulator 14 are separately passed through the plurality of through-holes 16B of the reinforcement sheet 16, whereby the reinforcement sheet 16 is attached to the first insulator 14. Thus, the flat surface 14C of the first insulator 14 is inserted into the opening portion 16A of the reinforcement sheet 16, and the edge portion of the opening portion 16A of the reinforcement sheet 16 makes contact with the circumferential surface 14D of the first insulator 14.

In addition, since the reinforcement sheet 16 has the thickness corresponding to the height difference in the Z direction between the flat surface 14C and the circumferential surface 14D of the first insulator 14, the reinforcement sheet 16 attached to the first insulator 14 forms the same plane as the flat surface 14C of the first insulator 14.

Figure 17:
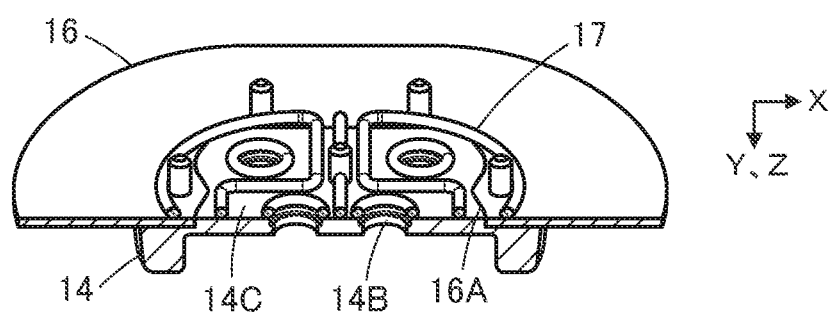
FIG. 17 is a partial cross-sectional perspective view showing a state where an adhesive agent is applied to the first insulator.

Next, as shown in FIG. 17, the adhesive agent 17 is applied on the flat surface 14C, facing in the −Z direction, of the first insulator 14 and on the edge portion of the opening portion 16A of the reinforcement sheet 16. At this time, the adhesive agent 17 is applied also on an edge portion of each of the four contact insertion holes 14B opening in the flat surface 14C of the first insulator 14.

Figure 18:
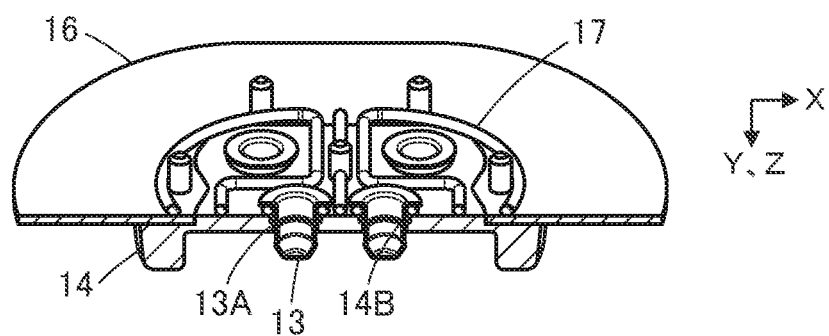
FIG. 18 is a partial cross-sectional perspective view showing a state where a contact is assembled to the first insulator.

Further, as shown in FIG. 18, the corresponding contact 13 is assembled to each of the four contact insertion holes 14B of the first insulator 14. The tubular portion 13A of each of the contacts 13 is inserted into the corresponding contact insertion hole 14B.

Figure 19:
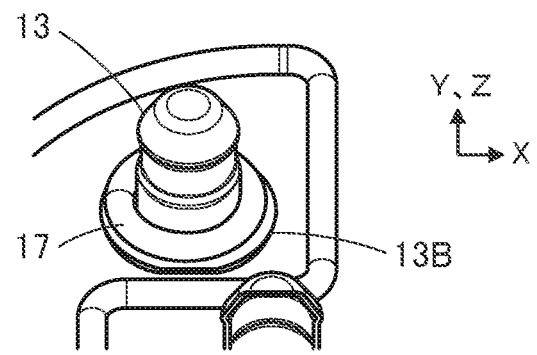
FIG. 19 is a partial perspective view showing a relationship between the adhesive agent and the contact with the first insulator being omitted.

At this time, with the first insulator 14 being omitted and when viewed from the +Z direction, as shown in FIG. 19, the adhesive agent 17 applied on the flat surface 14C of the first insulator 14 is situated on the flange 13B of each of the contacts 13.

Figure 20:
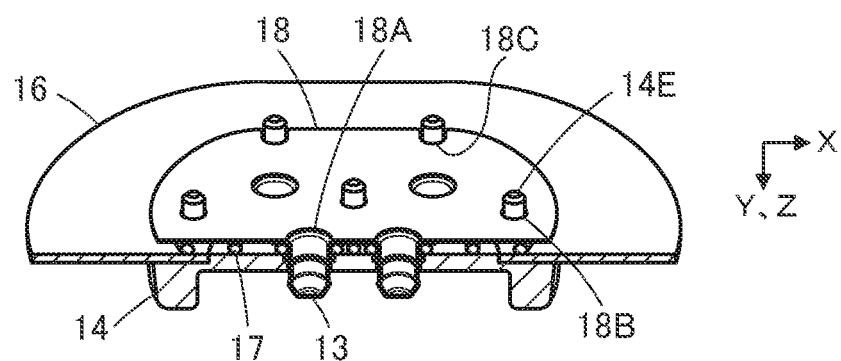
FIG. 20 is a partial cross-sectional perspective view showing a state where the protection sheet is assembled on the first insulator and the contact.

Next, as shown in FIG. 20, the protection sheet 18 is attached to the first insulator 14 on which the adhesive agent 17 is applied and to which the four contacts 13 are assembled. The protection sheet 18 is attached by having the plurality of fixing posts 14E of the first insulator 14 to separately pass through the plurality of through-holes 18B and the cutouts 18C of the protection sheet 18. At this time, the protection sheet 18 is disposed such that its surface on which the pressure-sensitive adhesive layer is formed faces in the −Z direction opposite to the first insulator 14, and each of the projection insertion holes 18A of the protection sheet 18 is disposed on the −Z direction side of the corresponding contact 13.

Figure 21:
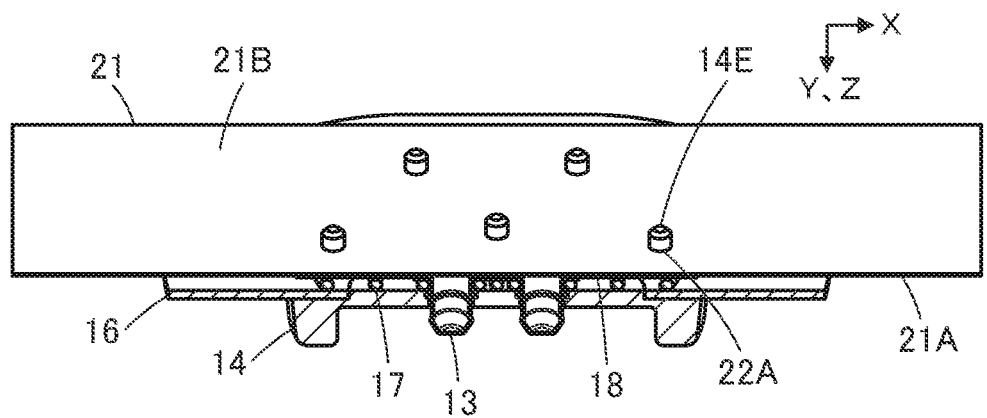
FIG. 21 is a partial cross-sectional perspective view showing a state where the flexible substrate is assembled on the protection sheet.

Further, as shown in FIG. 21, the flexible substrate 21 is moved from the −Z direction to the +Z direction while the plurality of fixing posts 14E of the first insulator 14 are separately passed through the plurality of through-holes 22A of the flexible substrate 21, whereby the flexible substrate 21 is assembled to the protection sheet 18 on the −Z direction side of the protection sheet 18. At this time, the flexible substrate 21 is disposed such that the front surface 21A on which the flexible conductors 23 are formed faces the protection sheet 18.

Figure 22:
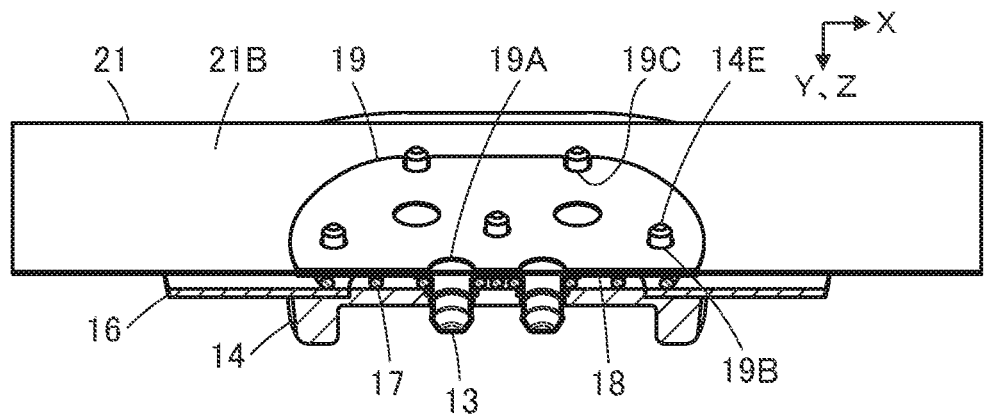
FIG. 22 is a partial cross-sectional perspective view showing a state where the fixing sheet is assembled on the flexible conductor.

Thereafter, as shown in FIG. 22, the fixing sheet 19 is attached to the rear surface 21B of the flexible substrate 21 while the plurality of fixing posts 14E of the first insulator 14 are separately passed through the plurality of through-holes 19B of the fixing sheet 19. At this time, the fixing sheet 19 is disposed such that its surface on which the pressure-sensitive adhesive layer is formed faces the rear surface 21B of the flexible substrate 21, and each of the projection insertion holes 19A of the fixing sheet 19 is disposed on the −Z direction side of the corresponding contact 13 with the flexible substrate 21 being sandwiched therebetween.

Figure 23:
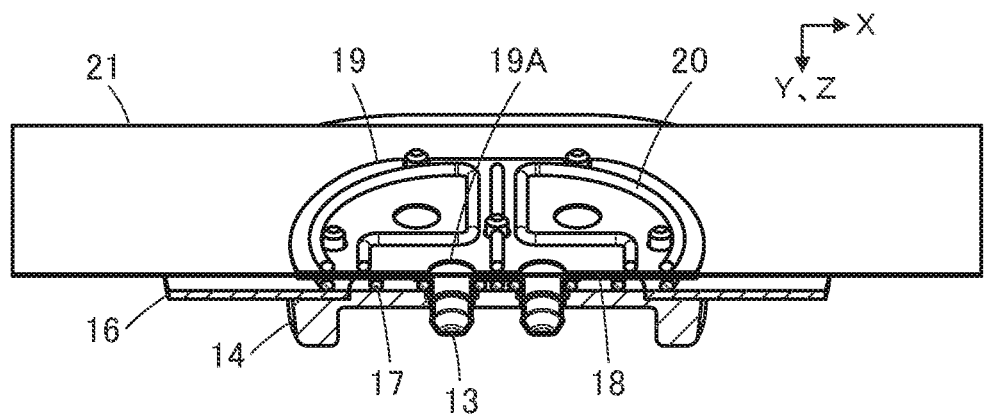
FIG. 23 is a partial cross-sectional perspective view showing a state where the adhesive agent is applied to the fixing sheet.
Figure 24:
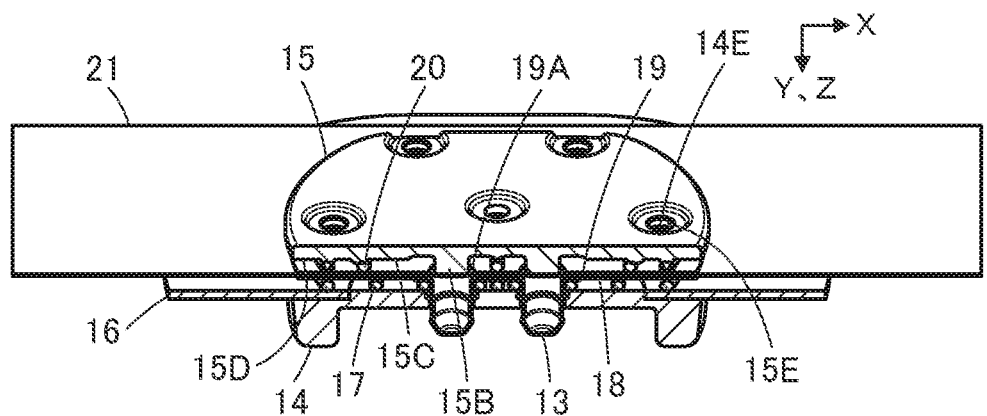
FIG. 24 is a partial cross-sectional perspective view showing a state where the second insulator is assembled.

Next, as shown in FIG. 23, the adhesive agent 20 is applied on the surface, facing in the −Z direction, of the fixing sheet 19, and thereafter, as shown in FIG. 24, the second insulator 15 is assembled to the first insulator 14 while the plurality of fixing posts 14E of the first insulator 14 are separately passed through the plurality of through-holes 15E of the second insulator 15. At this time, the flat surface 15C and the circumferential surface 15D of the second insulator 15 are disposed on the adhesive agent 20 applied on the surface of the fixing sheet 19, and a +Z directional end portion of the projection 15B is disposed in the projection insertion hole 19A of the fixing sheet 19.

Figure 25:
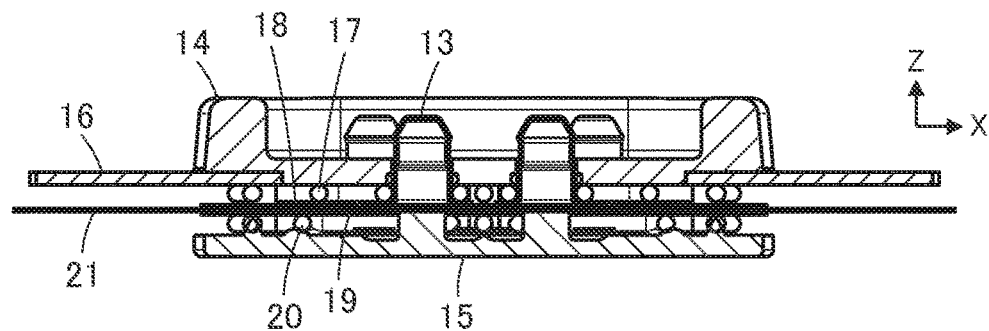
FIG. 25 is a cross-sectional view showing the state where the second insulator is assembled.

Thus, as shown in FIG. 25, the second insulator 15, the adhesive agent 20, the fixing sheet 19, the flexible substrate 21, the protection sheet 18, the four contacts 13, the adhesive agent 17, the reinforcement sheet 16, and the first insulator 14 are sequentially stacked from the −Z direction to the +Z direction.

In this state, while the second insulator 15 is relatively pressurized toward the first insulator 14, a heating treatment is performed in order to cure the adhesive agents 17 and 20.

When the second insulator 15 is relatively pressurized toward the first insulator 14, the adhesive agent 17 applied on the flat surface 14C of the first insulator 14 and the edge portion of the opening portion 16A of the reinforcement sheet 16 extends and spreads on an XY plane between the flat surface 14C of the first insulator 14 and the protection sheet 18, and the reinforcement sheet 16 and the protection sheet 18, and the adhesive agent 17 applied on the edge portions of the contact insertion holes 14B of the first insulator 14 fills between the contact insertion holes 14B and the tubular portions 13A of the contacts 13. Similarly, the adhesive agent 20 applied on the surface of the fixing sheet 19 extends and spreads on an XY plane between the fixing sheet 19 and the second insulator 15.

In addition, when a heating treatment is performed, the adhesive agents 17 and 20 each made of a thermosetting resin undergo a chemical reaction to be cured.

Thereafter, −Z directional ends, which project in the −Z direction from the plurality of through-holes 15E of the second insulator 15, of the plurality of fixing posts 14E of the first insulator 14 are heated and deformed, whereby the second insulator 15 is fixed to the first insulator 14, and the four contacts 13 are retained in the housing 12 constituted of the first insulator 14 and the second insulator 15.

Attachment of the connector 11 to the flexible substrate 21 is thus completed.

Figure 26:
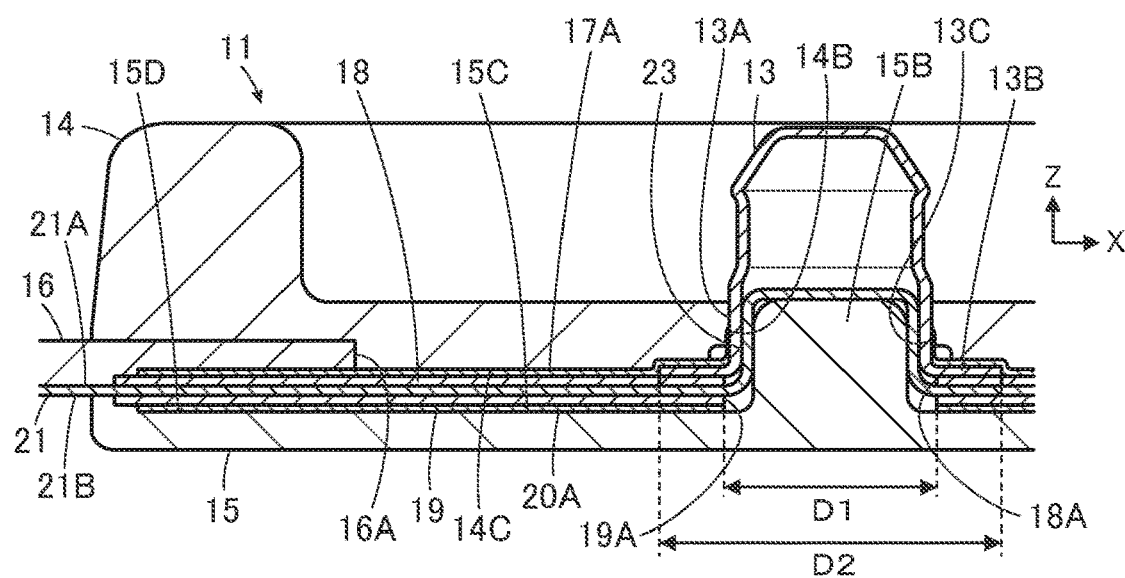
FIG. 26 is a partial enlarged cross-sectional view showing a main part of the connector according to Embodiment 1.

FIG. 26 shows a main part of the connector 11 attached to the flexible substrate 21 in this manner. The adhesive agents 17 and 20 are cured to form a first adhesive agent layer (adhesive layer) 17A and a second adhesive agent layer 20A, respectively.

The first adhesive agent layer 17A allows the surface, facing in the +Z direction, of the protection sheet 18 to be adhered to the flat surface 14C of the first insulator 14 and the edge portion of the opening portion 16A of the reinforcement sheet 16, the edge portion surrounding the opening portion 16A, and further, the first adhesive agent layer 17A fills between the tubular portion 13A and the contact insertion hole 14B of the first insulator 14 over the whole circumference of the tubular portion 13A of the contact 13. In addition, the second adhesive agent layer 20A allows the surface, facing in the −Z direction, of the fixing sheet 19 to be adhered to the flat surface 15C and the circumferential surface 15D of the second insulator 15.

In addition, the second insulator 15 is relatively pressurized toward the first insulator 14, whereby the projection 15B of the second insulator 15 makes contact with the rear surface 21B of the flexible substrate 21 in the projection insertion hole 19A of the fixing sheet 19 and is accommodated in the projection accommodating portion 13C of the contact 13 with the flexible substrate 21 being sandwiched therebetween, while pushing the flexible substrate 21 in the +Z direction through the projection insertion holes 18A of the protection sheet 18. Since the projection accommodating portion 13C has the inside diameter slightly smaller than a value obtained by adding a double of the thickness of the flexible substrate 21 to the outside diameter of the projection 15B, the flexible conductors 23 of the flexible substrate 21 are pressed by a lateral surface of the projection 15B against the inner surface of the projection accommodating portion 13C of the contact 13 such that a contact pressure is applied thereto, whereby the contact 13 is electrically connected to the flexible conductors 23.

In an XY plane along the protection sheet 18, the projection insertion hole 18A of the protection sheet 18 has an inside diameter D1 smaller than a size of a part of the contact 13, which part makes contact with the protection sheet 18, i.e., an outside diameter D2 of the flange 13B of the contact 13. In addition, the flange 13B of the contact 13 is situated on the +Z direction side of the protection sheet 18, and the first adhesive agent layer 17A is situated on the +Z direction side of the flange 13B of the contact 13. Further, the first adhesive agent layer 17A is disposed on the inner side of an outer peripheral portion of the protection sheet 18. Therefore, the first adhesive agent layer 17A does not make contact with the front surface 21A of the flexible conductor 21.

Similarly, the second adhesive agent layer 20A is disposed on the inner side of an outer peripheral portion of the fixing sheet 19 so that the second adhesive agent layer 20A does not make contact with the rear surface 21B of the flexible substrate 21.

In addition, an insulating film and a pressure-sensitive adhesive layer constituting each of the protection sheet 18 and the fixing sheet 19 each have a heat resistant temperature higher than a predetermined heating treatment temperature of adhesive agents separately constituting the adhesives 17 and 20.

Therefore, when the adhesive agents 17 and 20 are heated to the predetermined heating treatment temperature for the purpose of curing the adhesive agents 17 and 20, the flowing adhesive agents 17 and 20 are prevented from making contact with and applying a force to the flexible conductors 23 formed on the flexible substrate 21, particularly, the front surface 21A of the flexible substrate 21. Consequently, deformation and disconnection of the flexible conductors 23 caused by the flowing adhesive agents 17 and 20 are prevented.

In addition, since the adhesive agents 17 and 20 do not make direct contact with the flexible conductors 23, a constituent material of each of the adhesive agents 17 and 20 can be selected with high degree of freedom.

In addition, since the protection sheet 18 is adhered to the front surface 21A of the flexible substrate 21 with the pressure-sensitive adhesive layer and to the first insulator 14 and the reinforcement sheet 16 with the first adhesive agent layer 17A, and the fixing sheet 19 is adhered to the rear surface 21B of the flexible substrate 21 with the pressure-sensitive adhesive layer and to the second insulator 15 with the second adhesive agent layer 20A, water can be prevented from penetrating from the outside to the inside of the connector 11 through the front surface 21A and the rear surface 21B of the flexible substrate 21.

Further, since the first adhesive agent layer 17A fills between the tubular portion 13A and the contact insertion hole 14B of the first insulator 14 over the whole circumference of the tubular portion 13A of the contact 13, even when a waterproof member such as an O-ring is not used, water can be prevented from penetrating to the inside of the connector 11 through the contact insertion hole 14B of the first insulator 14.

While the first adhesive agent layer 17A and the second adhesive agent layer 20A are disposed on the inner side of the protection sheet 18 and on the inner side of the fixing sheet 19, respectively, in order to prevent water from penetrating from the outside to the inside of the connector 11 through the front surface 21A and the rear surface 21B of the flexible substrate 21, the first adhesive agent layer 17A and the second adhesive agent layer 20A are preferably disposed in a region equal to or larger than a predetermined area while surrounding the periphery of each of the four contacts 13.

In addition, since the flexible conductors 23 are formed only on the front surface 21A of the flexible substrate 21 and not exposed on the rear surface 21B of the flexible substrate 21, the fixing sheet 19 adhered to the rear surface 21B of the flexible substrate 21 may be omitted. As long as the protection sheet 18 is adhered to the front surface 21A of the flexible conductor 21, deformation and disconnection of the flexible conductors 23 caused by the flowing adhesive agent 17 can be prevented.

However, since the presence of the fixing sheet 19 can prevent the substrate body 22 of the flexible substrate 21 from directly receiving a force from the flowing adhesive agent 20, the fixing sheet 19 is preferably disposed between the rear surface 21B of the flexible substrate 21 and the adhesive agent 20 applied to the second insulator 15.

While the connector 11 according to Embodiment 1 above includes the four contacts 13, the invention is not limited thereto, and it suffices if at least one contact 13 is provided.

Embodiment 2

In Embodiment 1 above, as shown in FIGS. 12 and 13, the contact 13 includes the flange 13B that is formed integrally with the −Z directional end of the tubular portion 13A and extends out of the tubular portion 13A along an XY plane, but a contact having no flange may be used.

Figure 27:
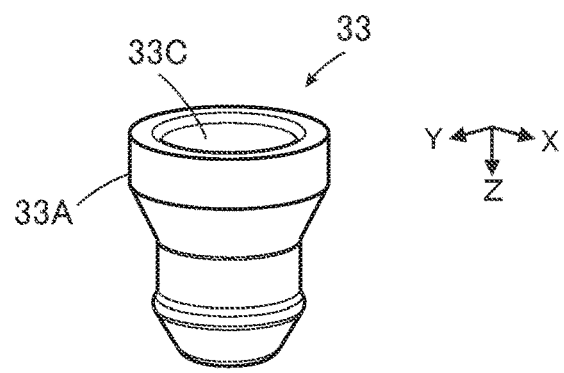
FIG. 27 is a perspective view showing a contact used in a connector according to Embodiment 2 when viewed from an obliquely lower position.

FIG. 27 shows a contact 33 used in Embodiment 2. The contact 33 is made of a conductive material such as metal and includes a tubular portion 33A of cylindrical shape that extends in the +Z direction, and the tubular portion 33A is provided in its interior with a projection accommodating portion 33C of recess shape opening in the −Z direction. The projection accommodating portion 33C has an inside diameter slightly smaller than a value obtained by adding a double of the thickness of the flexible substrate 21 to the outside diameter of the projection 15B of the second insulator 15. A flange extending out of the tubular portion 33A is not formed at a −Z directional end of the tubular portion 33A.

Figure 28:
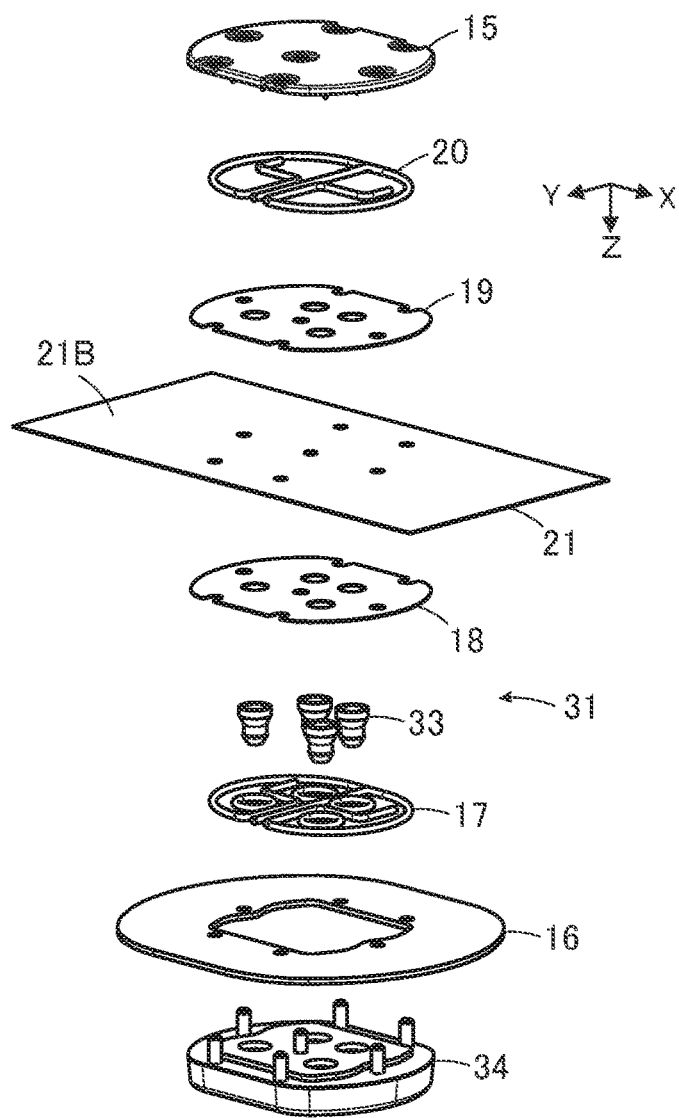
FIG. 28 is an assembly view showing the connector according to Embodiment 2 when viewed from an obliquely lower position.

FIG. 28 is an assembly view of a connector 31 according to Embodiment 2 having the contact 33 described above. The reinforcement sheet 16 is disposed on the −Z direction side of a first insulator 34, the four contacts 33 are disposed on the −Z direction side of the reinforcement sheet 16 via the adhesive agent 17, and the flexible substrate 21 is disposed on the −Z direction side of the four contacts 33 via the protection sheet 18. Further, the fixing sheet 19 is disposed on the −Z direction side of the flexible substrate 21, and the second insulator 15 is disposed on the −Z direction side of the fixing sheet 19 via the adhesive agent 20.

In other words, in the connector 31 according to Embodiment 2, the four contacts 33 and the first insulator 34 are used instead of the four contacts 13 and the first insulator 14, respectively, in the connector 11 of Embodiment 1, and the connector 31 otherwise has the same configuration as the connector 11 of Embodiment 1.

Figure 29:
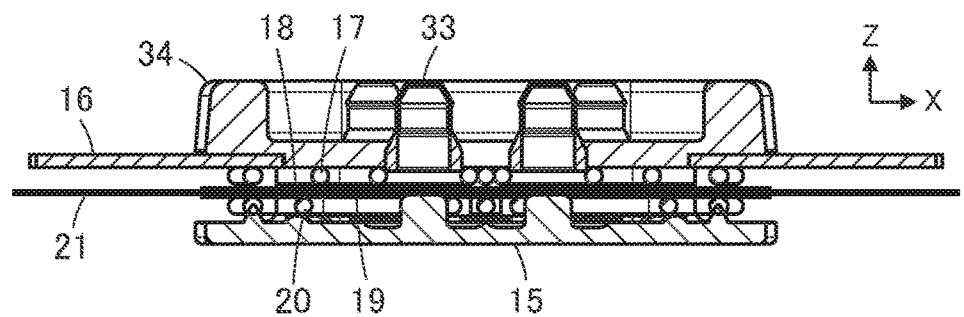
FIG. 29 is a cross-sectional view showing the connector according to Embodiment 2 in a state where the second insulator is assembled.

A method in which the connector 31 is attached to the flexible substrate 21 is the same as the method in which the connector 11 of Embodiment 1 is attached to the flexible substrate 21, and as shown in FIG. 29, the second insulator 15, the adhesive agent 20, the fixing sheet 19, the flexible substrate 21, the protection sheet 18, the four contacts 33, the adhesive agent 17, the reinforcement sheet 16, and the first insulator 34 are sequentially stacked from the −Z direction to the +Z direction. In this state, while the second insulator 15 is relatively pressurized toward the first insulator 34, a heating treatment is performed in order to cure the adhesive agents 17 and 20. Attachment of the connector 31 to the flexible substrate 21 is thus completed.

Figure 30:
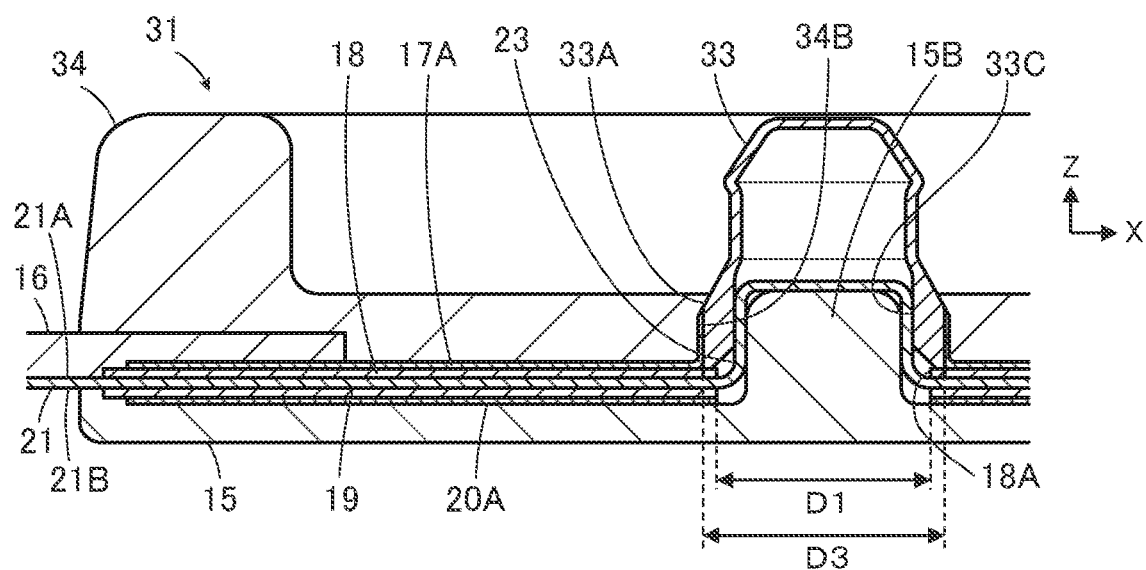
FIG. 30 is a partial enlarged cross-sectional view showing a main part of the connector according to Embodiment 2.

FIG. 30 shows a main part of the connector 31 attached to the flexible substrate 21. The first insulator 34 includes contact insertion holes 34B instead of the contact insertion holes 14B in the first insulator 14 in Embodiment 1, and otherwise has the same configuration as the first insulator 14 in Embodiment 1. The contact insertion hole 34B has a shape corresponding to the outer shape of the tubular portion 33A of the contact 33.

In an XY plane along the protection sheet 18, the projection insertion hole 18A of the protection sheet 18A has an inside diameter D1 smaller than a size of a part of the contact 33, which part makes contact with the protection sheet 18, i.e., an outside diameter D3 of the tubular portion 33A. In addition, a −Z direction end of the tubular portion 33A of the contact 33 is situated on the +Z direction side of the protection sheet 18, and the first adhesive agent layer 17A fills between the tubular portion 33A and the contact insertion hole 34B of the first insulator 34 over a whole circumference of the −Z direction end of the tubular portion 33A. Further, the first adhesive agent layer 17A is disposed on the inner side of an outer peripheral portion of the protection sheet 18. Therefore, the first adhesive agent layer 17A does not make contact with the front surface 21A of the flexible conductor 21.

Therefore, also in the connector 31 of Embodiment 2, when the adhesive agents 17 and 20 are heated to the predetermined heating treatment temperature, the flowing adhesive agents 17 and 20 can be prevented from making contact with and applying a force to the flexible substrate 21, particularly, the flexible conductors 23 formed on the front surface 21A of the flexible substrate 21.

Consequently, deformation and disconnection of the flexible conductors 23 caused by the flowing adhesive agents 17 and 20 are prevented.

Further, the second insulator 15 is relatively pressurized toward the first insulator 34 so that the projection 15B of the second insulator 15 is accommodated in the projection accommodating portion 33C of the contact 33 with the flexible substrate 21 being sandwiched therebetween, while pushing the flexible substrate 21 in the +Z direction. Since the projection accommodating portion 33C has the inside diameter slightly smaller than a value obtained by adding a double of the thickness of the flexible substrate 21 to the outside diameter of the projection 15B, the flexible conductors 23 of the flexible substrate 21 are pressed by the lateral surface of the projection 15B against the inner surface of the projection accommodating portion 33C of the contact 33 such that a contact pressure is applied thereto, whereby the contact 33 is electrically connected to the flexible conductors 23.

Also in the connector 31 of Embodiment 2, the protection sheet 18 is adhered to the front surface 21A of the flexible substrate 21 with the pressure-sensitive adhesive layer and to the first insulator 34 and the reinforcement sheet 16 with the first adhesive agent layer 17A, and the fixing sheet 19 is adhered to the rear surface 21B of the flexible substrate 21 with the pressure-sensitive adhesive layer and to the second insulator 15 with the second adhesive agent layer 20A, whereby water can be prevented from penetrating from the outside to the inside of the connector 11 through the front surface 21A and the rear surface 21B of the flexible substrate 21.

Further, since the first adhesive agent layer 17A fills between the tubular portion 33A and the contact insertion hole 34B of the first insulator 34 over the whole circumference of the −Z direction end of the tubular portion 33A of the contact 33, even when a waterproof member such as an O-ring is not used, water can be prevented from penetrating to the inside of the connector 31 through the contact insertion holes 34B of the first insulator 34.

Embodiment 3

In Embodiments 1 and 2 above, the projection 15B of the second insulator 15 is accommodated in the projection accommodating portion 13C, 33C of recess shape of the contact 13, 33 with the flexible substrate 21 being sandwiched therebetween, whereby the contact 13, 33 is electrically connected to the flexible conductor 23, but the invention is not limited thereto.

Figure 31:
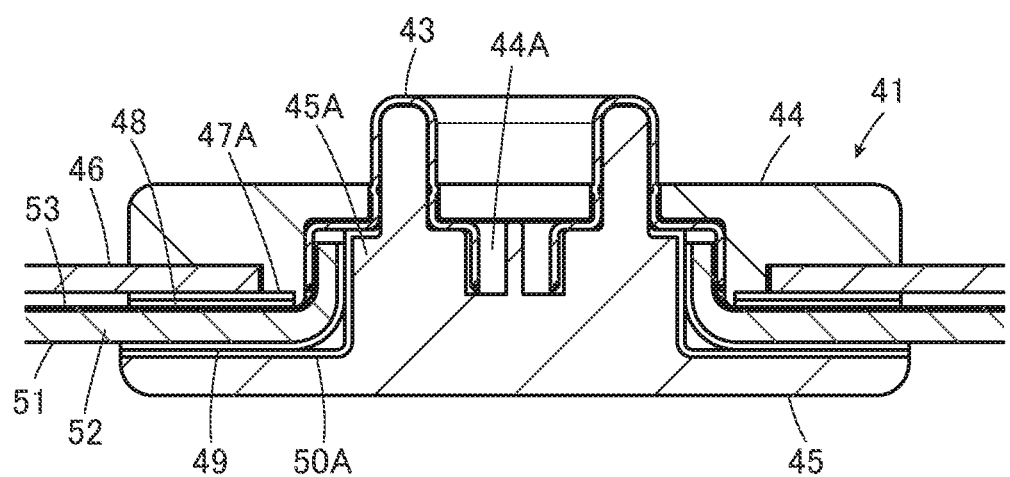
FIG. 31 is a cross-sectional view showing a connector according to Embodiment 3.
Figure 32:
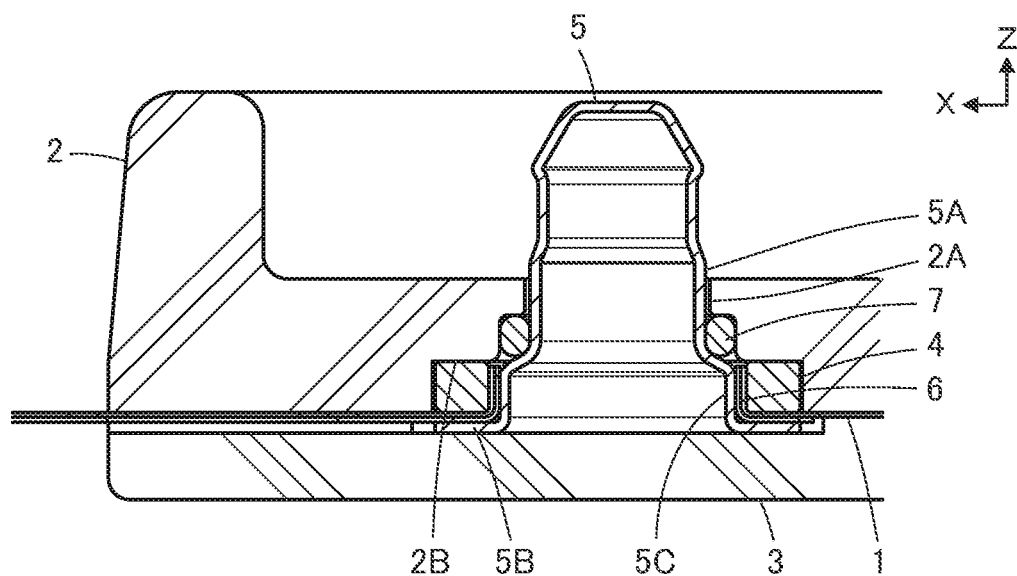
FIG. 32 is a partial cross-sectional view showing a conventional connector.

FIG. 31 shows a connector 41 according to Embodiment 3. The connector 41 includes a housing constituted of a first insulator 44 and a second insulator 45, a recessed portion 44A is formed in the first insulator 44, and the protruding portion 45A is formed in the second insulator 45.

The contact 43 constituted of a band-like member made of a conductive material such as metal is temporarily held in the recessed portion 44A of the first insulator 44. In this state, the second insulator 45 is assembled to the first insulator 44 with a flexible substrate 51 being sandwiched therebetween, whereby the connector 41 is attached to the flexible substrate 51.

The flexible substrate 51 is configured such that the flexible conductor 53 is formed, by printing, on a front surface of a substrate body 52 constituted of a resin film, a protection sheet 48 is disposed on a front surface, on which the flexible conductor 53 is exposed, of the flexible substrate 51, and a fixing sheet 49 is disposed on a rear surface, on which the flexible conductor 53 is not exposed, of the flexible substrate 51. The protection sheet 48 and the fixing sheet 49 are each obtained by forming a pressure-sensitive adhesive layer on one surface of an insulating film and are respectively adhered to the front surface and the rear surface of the flexible substrate 51 with the pressure-sensitive adhesive layers.

On a front surface of part of the flexible substrate 51, which part is situated in the recessed portion 44A of the first insulator 44, the protection sheet 48 is not disposed but the flexible conductor 53 is exposed, and the exposed flexible conductor 53 makes contact with the contact 43, with predetermined contact pressure, temporarily held in the recessed portion 44A of the first insulator 44 by the protruding portion 45A of the second insulator 45, whereby the contact 43 is electrically connected to the flexible conductor 53.

In addition, the protection sheet 48 is adhered to the first insulator 44 and the reinforcement sheet 46 with a first adhesive agent layer 47A (adhesive layer), and the fixing sheet 49 is adhered to the second insulator 45 with a second adhesive agent layer 50A, whereby water is prevented from penetrating to a connection part between the contact 43 and the flexible conductor 53.

Here, the protection sheet 48 is present between the flexible substrate 51 and the first adhesive agent layer 47, the fixing sheet 49 is present between the flexible substrate 51 and the second adhesive agent layer 50A, and the first adhesive agent layer 47A and the second adhesive agent layer 50A do not make direct contact with the flexible substrate 51. An insulating film and a pressure-sensitive adhesive layer constituting each of the protection sheet 48 and the fixing sheet 49 each have a heat resistant temperature higher than a predetermined heating treatment temperature of adhesive agents separately constituting the first adhesive agent layer 47A and the second adhesive agent layer 50A.

Thus, when the adhesive agents separately constituting the first adhesive agent layer 47A and the second adhesive agent layer 50A are heated to the predetermined heating treatment temperature, the flowing adhesive agents can be prevented from making contact with and applying a force to the flexible substrate 51, and consequently, deformation and disconnection of the flexible conductor 53 caused by the flowing adhesive agents can be prevented.

With this configuration, also in the connector 41 in which the contact 43 is electrically connected to the flexible conductor 53, the second insulator 45 is assembled to the first insulator 44 with the flexible substrate 51 being sandwiched therebetween, whereby disconnection of the flexible conductor 53 when the adhesive agents are heated to provide waterproof property can be prevented, and highly reliable electrical connection can be established.

In Embodiments 1 to 3, as the adhesive agent 17 constituting the first adhesive agent layer 17A, the adhesive agent 20 constituting the second adhesive agent layer 20A, and the adhesive agents separately constituting the first adhesive agent layer 47A and the second adhesive agent layer 50A, an adhesive agent made of a thermosetting resin is used, but it suffices if an adhesive agent which is cured by a heating treatment is used, and an adhesive agent made of a thermoplastic resin may also be used. For example, an adhesive agent made of a thermoplastic resin takes on a solid at room temperature, is softened when heated, and then cured when cooled. Such an adhesive agent made of a thermoplastic resin is disposed on the corresponding adhesive position and subjected to a heating treatment. The adhesive agent thus softened to be flowing is pressurized and fills the adhesive position, and then is cooled and cured to form the first adhesive agent layer 17A, 47A or the second adhesive agent layer 20A, 50A.

In addition, while, in Embodiments 1 to 3, the connector 11, 31, 41 is attached to the flexible substrate 21, 51 along with the reinforcement sheet 16, 46, the reinforcement sheet 16, 46 may be omitted when it is not particularly necessary to reinforce the flexible substrate 21, 51.

What is claimed is:

1. A connector attached to a flexible substrate having a sheet-like shape and having a flexible conductor formed on a front surface of a substrate body, the connector comprising:
   at least one contact made of a conductive material and connected to the flexible conductor,
   a housing that is attached to the flexible substrate and retains the contact; and
   a protection sheet constituted of an insulating film having a pressure-sensitive adhesive layer formed on one surface of the protection sheet and disposed between the housing and the flexible substrate such that the pressure-sensitive adhesive layer faces the flexible substrate,
   wherein the protection sheet is disposed so as to cover at least a front surface part of the flexible substrate on which the flexible conductor is formed, and is adhered to the flexible substrate with the pressure-sensitive adhesive layer,
   wherein the housing has a flat surface facing the flexible substrate, and
   wherein an adhesive layer bonding the housing to the protection sheet is disposed between the flat surface and the protection sheet.

2. The connector according to claim 1,
   wherein the housing includes: a first insulator that is disposed on one surface of the flexible substrate and retains the contact; and the second insulator that is disposed on another surface of the flexible substrate, and
   wherein each of the first insulator and the second insulator has the flat surface.

3. The connector according to claim 2,
   wherein the flexible conductor is formed on the one surface of the flexible substrate, wherein the protection sheet is disposed between the first insulator and the one surface of the flexible substrate, wherein the protection sheet is adhered to the one surface of the flexible substrate with the pressure-sensitive adhesive layer, and wherein a first adhesive agent layer which becomes the adhesive layer is disposed between the flat surface of the first insulator and the protection sheet.

4. The connector according to claim 3, further including a fixing sheet constituted of the insulating film and disposed between the second insulator and the another surface of the flexible substrate such that the pressure-sensitive adhesive layer faces the another surface of the flexible substrate, wherein the fixing sheet is adhered to the another surface of the flexible substrate with the pressure-sensitive adhesive layer, and wherein a second adhesive agent layer bonding the second insulator to the fixing sheet is disposed between the flat surface of the second insulator and the fixing sheet.

5. The connector according to claim 3, wherein a second adhesive agent layer bonding the second insulator to the flexible substrate is disposed between the flat surface of the second insulator and the another surface of the flexible substrate.

6. The connector according to claim 3, wherein the contact includes a projection accommodating portion of recess shape, wherein the second insulator has a projection projecting toward the another surface of the flexible substrate, and wherein the projection is accommodated in the projection accommodating portion with the flexible conductor being sandwiched therebetween, whereby the contact is electrically connected to the flexible conductor.

7. The connector according to claim 6, wherein the protection sheet includes a projection insertion hole disposed at a position corresponding to the projection accommodating portion of the contact, and wherein the projection is accommodated in the projection accommodating portion together with the flexible substrate via the projection insertion hole.

8. The connector according to claim 7, wherein in a plane along the protection sheet, the projection insertion hole has a size smaller than that of part of the contact, the part making contact with the protection sheet.

9. The connector according to claim 7, wherein the contact has a tubular portion extending in a direction perpendicular to the flexible substrate, wherein the projection accommodating portion is disposed inside the tubular portion, and wherein the contact is disposed such that the projection accommodating portion is disposed to be aligned with the projection insertion hole.

10. The connector according to claim 9, wherein the contact includes a flange extending from one end of the tubular portion in a direction parallel to the flexible substrate, and wherein the contact is disposed such that a whole circumference of the flange overlaps and makes contact with the protection sheet.

11. The connector according to claim 9, wherein the first insulator includes a contact insertion hole penetrating the first insulator, and wherein the contact is retained in the first insulator with the tubular portion being inserted into the contact insertion hole.

12. The connector according to claim 11, wherein the first adhesive agent layer fills between the tubular portion of the contact and the contact insertion hole over a whole circumference of the tubular portion.

13. The connector according to claim 3, wherein the second insulator is assembled to the first insulator with the flexible substrate being sandwiched therebetween, whereby the contact is electrically connected to the flexible conductor.

14. The connector according to claim 3, further including a reinforcement sheet disposed between the first insulator and the one surface of the flexible substrate, wherein the reinforcement sheet includes an opening portion situated on an inner side of an outer peripheral portion of the protection sheet, and wherein the protection sheet is adhered to the flat surface of the first insulator via the opening portion and to an edge portion of the opening portion with the first adhesive agent layer.

15. The connector according to claim 3, wherein the first adhesive agent layer is disposed on an inner side of an outer peripheral portion of the protection sheet.

16. The connector according to claim 15, wherein the first adhesive agent layer is disposed in a region equal to or larger than a predetermined area.

17. The connector according to claim 1, wherein the adhesive layer is made of an adhesive agent that is cured by a heating treatment, and wherein each of the insulating film and the pressure-sensitive adhesive layer has a heat resistant temperature higher than a heating treatment temperature of the adhesive agent.

18. The connector according to claim 17, wherein the adhesive agent is made of a thermosetting resin or a thermoplastic resin.

* * * * *

UNITED STATES PATENT AND TRADEMARK OFFICE
CERTIFICATE OF CORRECTION

PATENT NO. : 12,237,597 B2  
APPLICATION NO. : 17/842518  
DATED : February 25, 2025  
INVENTOR(S) : Seiya Matsuo et al.

Page 1 of 1

It is certified that error appears in the above-identified patent and that said Letters Patent is hereby corrected as shown below:

In the Claims

In Column 14, Line 60, In Claim 2, delete "the second" and insert -- a second --

Signed and Sealed this  
Twenty-ninth Day of April, 2025

Coke Morgan Stewart  
*Acting Director of the United States Patent and Trademark Office*